United States Patent [19]

Migita et al.

[11] Patent Number: 5,045,894
[45] Date of Patent: Sep. 3, 1991

[54] COMPOUND SEMICONDUCTOR LIGHT EMITTING DEVICE

[75] Inventors: Masahito Migita, Hachioji; Akira Taike, Kokubunji; Masatoshi Shiiki, Musashimurayama, all of Japan

[73] Assignee: Hitachi, Ltd., Tokyo, Japan

[21] Appl. No.: 369,822

[22] Filed: Jun. 22, 1989

[30] Foreign Application Priority Data

Jun. 29, 1988 [JP] Japan .............................. 63-159413
Aug. 22, 1988 [JP] Japan .............................. 63-206469

[51] Int. Cl.$^5$ .......................................... H01L 33/00
[52] U.S. Cl. ....................................... 357/17; 357/4; 357/16; 357/61; 357/58
[58] Field of Search ................. 357/4 SL, 16, 17, 61, 357/56, 58

[56] References Cited

U.S. PATENT DOCUMENTS

| | | | |
|---|---|---|---|
| 4,546,480 | 10/1985 | Burnham et al. | 357/16 |
| 4,644,553 | 2/1987 | Van Ruyven et al. | 357/17 |
| 4,840,446 | 6/1989 | Nakamura et al. | 357/17 |
| 4,868,612 | 9/1989 | Oshima et al. | 357/16 |
| 4,868,615 | 9/1989 | Kamata | 357/17 |

FOREIGN PATENT DOCUMENTS

| | | | |
|---|---|---|---|
| 57-5325 | 1/1982 | Japan | 357/17 |
| 57-7171 | 1/1982 | Japan | 357/17 |
| 59-188179 | 10/1984 | Japan | 357/4 SL |
| 60-1874 | 1/1985 | Japan | 357/17 |
| 61-144079 | 7/1986 | Japan | 357/4 SL |
| 61-263288 | 11/1986 | Japan | 357/17 |
| 62-211971 | 9/1987 | Japan | 357/17 |
| 53-296484 | 12/1987 | Japan | 357/17 |
| 63-37678 | 2/1988 | Japan | 357/17 |
| 63-124408 | 5/1988 | Japan | 357/16 |
| 63-240084 | 10/1988 | Japan | 357/17 |

OTHER PUBLICATIONS

Nishizawa et al., "Blue Light Emission from ZnSe p—n Junctions", J. Appl. Phys. 57(6), 3/15/85, pp. 2210-2216.
Mandel et al., "Self—Compensation—Limited Conductivity in Binary Semiconductors", Physical Review, vol. 136, No. 3A, 11/2/64.
Kamata et al., "Emission Characteristics of a Selectively Si—Doped Ga/AlGaAs Quantum Well", Science & Technical Research, 11/2/87.
Tsang, "AlGaAs/AlGaAs . . . Epitaxy", Integrated and Guided—Wave Optics Technical Digest, 1/1980.
Kobayashi et al., "Growth of a ZnTe—ZnSe . . . Epitaxy", Appl. Phys. Lett. 48(4), 1/1986.
Kobayashi et al., "Realization of Both p— and n—type . . . superlattices", Appl. Phys. Lett. 51(20), 11/87.
Ackley et al., "GaAs Light—Emitting . . . Diffusion", Appl. Phys. Lett. 53(2), 7/88.
Kobayashi et al., "Lattice Strain . . . Superlattices", Appl. Phys. Lett. 61(3), 2/1987.

Primary Examiner—Rolf Hille
Assistant Examiner—Minhloan Tran
Attorney, Agent, or Firm—Antonelli, Terry, Stout & Kraus

[57] ABSTRACT

Strained-layer superlattices are formed on a substrate by alternately and epitaxially laminating a plurality of first compound semiconductor layers each of which is composed of a II-Vi compound semiconductor and second compound semiconductor layers each of which is composed of a II-VI or III-V compound semiconductor having a smaller lattice constant than the compound semiconductor of the first compound semiconductor layer. A first conduction type impurity diffusion region is formed in at least each layer surface of the first compound semiconductor layers, and a second conduction type region is so formed as to be adjacent to the first conduction type impurity diffusion region directly or through an undoped region. Electrodes are provided on the end side surfaces of the respective regions. The thus-obtained compound semiconductor light emitting device efficiently emits light in the visible region including green to blue wavelength region.

17 Claims, 4 Drawing Sheets

COMPOUND SEMICONDUCTOR LIGHT EMITTING DEVICE

BACKGROUND OF THE INVENTION

The present invention relates to a compound semiconductor light emitting device and, more particularly, to a compound semiconductor light emitting device using a II-VI compound semiconductor and having a novel structure which is suitable for a light emitting device.

A compound semiconductor light emitting device in the wavelength region of an infrared or red visible region having a hetero-junction structure consisting of a III-V compound semiconductor such as $In_{1-x}Ga_xP_{1-y}As_y$/GaAs and $Ga_{1-x}Al_xAs$/GaAs ($0 < x$, $y < 1$) is conventionally used. A III-V compound semiconductor, however, is unsuitable for a semiconductor laser for a shorter wavelength region such as a green or blue wavelength region mainly because the intrinsic energy gap of the material is too small.

As a countermeasure, development of a light emitting device using a II-VI compound semiconductor has been attempted. For example, J.Appl. Phys. 57 (6), (1985) reports on page 2210 to 2216 that light emission in a blue wavelength region has been obtained from a p-n junction formed by diffusing Ga in bulk ZnSe. The formation of a p-n junction on ZnSe is also described in Japanese Patent Publication Nos. 5337/1987 and 5338/1987.

A II-VI compound, which generally has a large energy gap, is expected as a material for realizing a device for emitting light in a green to blue light emitting wavelength region. In most of II-VI compounds, however, the control of a p-n junction by the diffusion of impurities is almost impossible due to the self-compensation. Therefore, either a p-type or n-type semiconductor is only formed from a II-VI compound except CdTe, and it is very difficult to form both p-type and n-type regions in one semiconductor crystal.

A semiconductor having a strong ionicity such as most of II-VI compound semiconductors is unipolar. In other words, such a crystal is either n or p conduction type. If impurities easy to ionize enter a crystal having a strong ionicity and only one conduction type, a lattice defect (vacancy) is ionized to the opposite charge so as to retain the electric neutrality in the interior of the crystal. The electrons and holes generated by the introduction of the impurities and the ionization of the lattice defect caused thereby combine with each other and emit energy (Er). In a crystal having a strong ionicity, the formation enthalpy ($\Delta Hv$) is smaller than Er in comparison with a crystal having a weak ionicity, so that as impurities are introduced more, the lattice defects increase, thereby substantially completely compensating the carriers generated by the addition of the impurities.

Whether the semiconductor is a p or n conduction type is determined by the ionizing energy of a vacancy and if a vacancy of an element of the II group is an acceptor and a vacancy of an element of the VI group is a donor, the ionizing energy of a vacancy has some relationship with the dimension of the vacancy (see Phys. Rev. 136, 3A (1964) page A826 to A832). A small ionized vacancy has a smaller ionizing energy than a large ionized vacancy, so that the self-compensation increases. For example, in the case of ZnS, the compensation of the S vacancy for p-type impurities is larger than the compensation of Zn vacancy for the n-type impurities, but in the case of ZnTe, since the Te vacancy has a large size, the compensation of the Zn vacancy for n-type impurities is larger than the compensation of Te vacancy for the p-type impurities. Actually, ZnS is an n-type unipolar compound, while ZnTe is a p-type unipolar compound. Such a phenomenon is called charge-compensation or self-compensation.

It has recently been reported a p-n junction is formed by diffusing Ga in bulk p-type ZnSe and bluelight emission is obtained, as described above. In this case, however a broad light emission peak is also realized in a red region other than the blue light region, thereby disadvantageously lowering the efficiency of blue light emission. In order to produce a light emitting device having a good efficiency, it is essential to form a thin film p-n junction having a lattice matching, preferably a p-n homojunction, but no report has been made on such technique.

Additionally, the relationship between the introduction of impurities and a lattice defect density in a III-V compound semiconductor is described in "Oyobutsuri" (Applied Physics), Vol 57, No. 2 (1988), page 216 to 220.

SUMMARY OF THE INVENTION

Accordingly, it is an object of the present invention to eliminate the above-described problems in the prior art and to provide a novel compound semiconductor light emitting device which enables a p-n control with a good lattice-matching by using a II-I compound semiconductor having a band gap capable of emitting light of a shorter length than red, and which emits light in the visible region ranging from red to blue.

To achieve this aim, according to the present invention, strained-layer superlattices are formed and a II-VI compound semiconductor is used for a superlattice layer subject to a compressive strain. The "strained-layer superlattice" means a structure consisting of a superlattice each layer of which has predetermined strains.

The above and other objects, features and advantages of the present invention will become clear from the following description of the preferred embodiment thereof, taken in conjunction with the accompanying drawings.

DESCRIPTION OF THE PREFERRED EMBODIMENTS

Figure 1A:
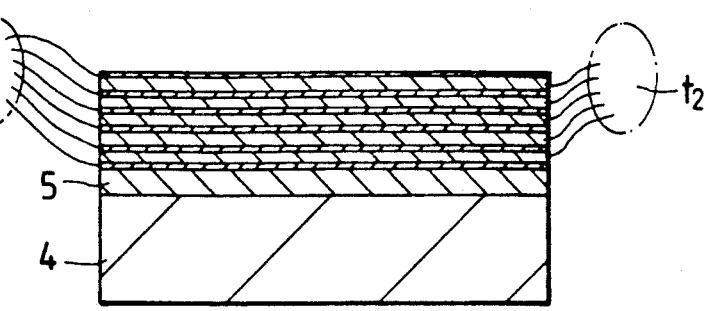
Figs. 1a to 1e are sectional views showing the process for producing a compound semiconductor light emitting device in an embodiment according to the present invention.

The present invention will be explained in more detail. The object of the present invention is achieved by a compound semiconductor light emitting device comprising: strained-layer superlattices composed of a plurality of layers which are obtained by the alternate epitaxial growth of at least two kinds of, namely, first and second II-VI compound semiconductor layers having different compositions from each other on a substrate; a first conduction type region and a second conduction type region provided in each layer surface of at least the first II-VI compound semiconductor layers in such a manner as to be adjacent to each other; and electrodes provided on the end surfaces of the respective conduction type regions.

In other words, the first II-VI compound semiconductor layer constitutes a superlattice layer subject to a compression strain in the strained-layer superlattices. As is well known, if the first conduction type is n-type, the second conduction type is p-type, and conversely, if the first conduction type is p-type, the second conduction type is n-type. It is possible to provide a buffer layer between the substrate and the strained-layer superlattices.

The preferred relationship between the first and second II-I compound semiconductor layers constituting the strained-layer superlattices will be described. In the first II-VI compound semiconductor layer, the degree of lattice-mismatch with respect to the second II-VI compound semiconductor layer is not more than 20% and the thickness of one layer is not less than 1 atomic layer and not more than 40 Å. The lattice constant of the second II-VI compound semiconductor layer is smaller than that of the first II-VI compound semiconductor layer and the thickness of one layer thereof is larger than that of the first II-VI compound semiconductor layer by at least 60 Å, preferably 100 to 500 Å. The above-described degree of lattice-mismatch is important for forming a compressive strain, and is preferably 1 to 9%.

If the thickness of the first II-VI compound semiconductor layer exceeds 40 Å, lattice relaxation begins to occur within the layer of the strained-layer superlattices, thereby unfavorably making it difficult to produce uniform strained-layer superlattices. In order to concentrate a strain energy on the first compound semiconductor layer and to prevent the second compound semiconductor layer from being strained as much as possible, it is necessary that the second compound semiconductor layer has a thickness of not less than 60 Å. There is no special upper limit in the thickness of the second compound semiconductor layer.

The degree of lattice-mismatch in the present invention is defined as follows. If it is assumed that the lattice constant of the first compound semiconductor layer is a and the difference between the lattice constant of the first compound semiconductor layer and the lattice constant of the second compound semiconductor layer is $\Delta a$, $(\Delta a/a) \times 100$ (%) is the degree of lattice-mismatch.

If both first and second compound semiconductor layers consist of II-I compound semiconductors, a combination of CdTe - ZnS has the largest degree of lattice-mismatch such as 20.0%. The degree of lattice-mismatch of strained-layer superlattices composed of a combination of ZnS - ZnTe is 13.0%.

It is not necessary that the first and second II-VI compound semiconductor layers have the same crystal form, but the number of bonds on the interface between the first and second semiconductor layers must be the same because each semiconductor layer must be formed by epitaxial growth. For example, it is known that a diamond structure and a zinc blende structure has different crystal forms but are easy of epitaxial growth, and that the face (100) of a zinc blende structure and the face (111) of a wurtzite structure are capable of epitaxial growth.

In the present invention, the second II-VI compound semiconductor layer may be replaced by a III-V compound semiconductor layer. A p-n region is so formed as to be adjacent to each other in the same layer surface of the strained-layer superlattices and it is necessary that a p-n region is formed at least on each of the plurality of the first II-VI compound semiconductor layers laminated. A p-n region is not necessarily selectively provided only on the first II-VI compound semiconductor layer and may also be provided on the second II-VI compound semiconductor layer.

The object of the present invention is also achieved by a compound semiconductor light emitting device comprising: the above-described strained-layer superlattices; a single-layer second conduction type semiconductor layer provided on the same substrate as the strained-layer superlattice in contact with one end side surface thereof and composed of a second conduction type unipolar II-VI compound semiconductor or a second conduction type III-V compound semiconductor with impurities diffused therein; a first conduction type impurity diffusion region provided in each of at least the first II-VI compound semiconductor layers of the strained-layer superlattices; an electrode provided on the end surfaces of the first II-VI compound semiconductor layers; and the other electrode provided on the end surface of the single-layer second conduction type semiconductor layer.

The total thickness of the strained-layer superlattices is not specified but a thickness of about 500 to 5,000 Å is practical.

As an electrode provided on the end side surface, a metal material may be used directly in ohmic contact therewith. More preferably, the electrodes may be constituted by III-V compound semiconductor layers with impurities diffused therein corresponding to the respective conduction types, and further metal electrodes are provided on the thus-produced electrodes in ohmic contact therewith as lead-in electrodes.

It is also preferable that the refractive indices of the electrodes of III-V compound semiconductors with impurities diffused therein provided on both end side surfaces are smaller than those of the strained-layer superlattices and the single-layer second conduction type semiconductor layer and that the refractive index of the substrate itself is also smaller or a buffer layer having a small refractive index is provided on the substrate, whereby at least the side walls and the bottom portion of the light emitting device except the light emitting region including the cleavage plane is composed of a material having a small refractive index so that the wall surface constitutes a reflective surface. Thus, when a light emission device is a device for emitting light in all directions such as a light emitting diode, it is possible to efficiently take out the reflected light from the light emitting surface as output light.

When a p-n region is provided in the same layer surface of the strained-layer superlattices, an undoped region having a narrow width (corresponding to the thickness of the active layer of a semiconductor laser, ordinarily, 50 Å to 0.3 μm) may be provided, if necessary, on the interface of the p-n region. If the compound semiconductor light emitting device has the above-described structure, the undoped region is used as the light emitting (active) region, an optical confinement means is provided therearound and the length of the active region is a cavity length (corresponding to the thickness or the depth orthogonal to the thickness of the strained-layer superlattices), there a semiconductor laser is realized.

As examples of a practical element of the II group constituting the first or second II-VI compound semiconductor layer, at least one of zinc and cadmium will be cited, and as examples of an element of the VI group, at least one of chalcogens such as S, Se and Te will be cited. As examples of a practical element of the III group constituting the III-V compound semiconductor layer, at least one of gallium, indium and aluminum will be cited, and as examples of an element of the V group, at least one of arsenic and phosphorus will be cited.

When the strained-layer superlattices are composed of a combination of the first and second II-VI compound semiconductor layers, the compositions of the respective compounds are differentiated so as to provide a difference in the lattice constants thereof. Alternate epitaxial growth of the first and second II-IV compound semiconductor layers induced such that the lattice constant of the second semiconductor layer is smaller so as to apply a compressive strain to the first II-VI compound semiconductor layer and the necessary difference in thickness is provided between the first and second II-VI composite semiconductor layers facilitates the production of the strained-layer superlattices. Desirable differences between the compositions of the first and second compound semiconductor layers are easily determined by experiments. The substrate may be any insulating substrate or semiconductor substrate that is suitable for epitaxial growth. For example, a semiconductor GaAs sheet is practical. The buffer layer may be made of any material that is suitable for epitaxial growth. For example, ZnS, ZnSe and ZnSSe are usable. As the technique for epitaxial growth, known MBE (Molecular Beam Epitaxy) or known MOCVD (Metalorganic Vapor Phase Deposition) is usable. A known technique is also applicable to impurity element doping for determining the first or the second conduction type. For example, in the case of using MOCVD, if the necessary amount of organometallic compound for doping is mixed with a source gas for forming an epitaxial film, doping is facilitated.

As described above, difficulty in the formation of a p-n junction due to the self-compensation is eliminated by the adoption of the strained-layer superlattices. The self-compensation is more effectively cancelled by using at least two kinds of elements as the impurity elements introduced to the p-type or n-type region which is difficult to form, one being an element having a larger covalent radius than an element constituting the semiconductor crystal, the other being an element having a smaller covalent radius. In this case, the covalent radius of the impurity element may be determined on the basis of the covalent radius of any of the at least two elements constituting the compound semiconductor. The concentration ratio of the impurity element introduced into the crystal is determined by the above-described covalent radius relationship so as to control the conduction type of the semiconductor crystal.

For example, in the II-VI compound semiconductor, if an element of the II group is substituted by an element of the I group, the region becomes a p-type, and if it is substituted by an element of the III group, the region becomes an n-type. If an element of the VI group is substituted by an element of the V group, the region becomes a p-type, and if it is substituted by an element of the VII group, the region becomes an n-type. Therefore, in order to control the semiconductor so as to be of a p conduction type, elements of the I group having a smaller covalent radius and a larger covalent radius, respectively, than an element of the II group are introduced, or elements of the V group having a smaller covalent radius and a larger covalent radius, respectively, than an element of the VI group are introduced. Alternatively, an element of the I group having a smaller covalent radius than an element of the II group and an element of the V group having a larger covalent radius than an element of the VI group may be introduced. Two kinds or more of elements having a smaller covalent radius may be introduced. The same is applied to an element having a larger covalent radius.

If ZnS, ZnSe, ZnTe or a mixed crystal thereof is selected as the II-VI compound semiconductor, since the covalent radius of zinc is considered 1.25 to 1.31 Å from the Zn lattice radius of a zinc blende crystal structure and the covalent radii of the elements of the I group Li, Na, K, Ag and Au are 1.23 Å, 1.54 Å, 2.03 Å. 1.39 Å and 1.34 Å, respectively, the semiconductor is so controlled as to have a p conduction type by introducing Li and at least one element selected from among Na, K, Ag and Au. Similarly, since the covalent radii of the elements of the III group B, Al, Ga In, Tl, Sc, Y and La are 0.88 Å, 1.18 Å, 1.26 Å. 1.44 Å, 1.48 Å, 1.44 Å, 1.02 Å and 1.69 Å, respectively, the semiconductor is so controlled as to have an n conduction type by introducing at least one element selected from among B, Al and Ga and at least one element selected from among In, Tl, Sc, Y and La. Similarly, it is possible to control the semiconductor so as to be of a p conduction type by introducing at least two elements selected from among the elements of the V group N, P, As and Sb, and to control the semiconductor so as to be of an n conduction type-by introducing at least two from the elements of the VII group F, Cl, Br and I.

When two kinds of elements of the II group are used as in (Zn, Cd) $S_xSe_yTe_{1-x-y}(0<x+y<1, x, y>0)$, the covalent radius of the element of the II group is determined by the weighted average of the covalent radii of the respective elements in consideration of the composition ratio.

As described above, if an element having a larger covalent radius and an element having a smaller covalent radius than an element constituting the semiconductor crystal are introduced into the crystal, the conduction type controlling effect is produced. More preferably, the concentration ratio is so determined that the average covalent radius of those elements is substantially equal to the covalent radius of an element constituting the semiconductor crystal. The above-mentioned value may be varied in the range of ±50%.

A method of enhancing the carrier density by doping an element having a larger covalent radius and an element having a smaller covalent radius than an element constituting the semiconductor crystal into a III-V compound semiconductor is described in Japanese Patent Laid-Open No. 24408/1988.

It is conventionally difficult to form both p and n regions in one semiconductor crystal of a II-VI compound semiconductor due to the self-compensation, as described above.

According to the experiments and investigation carried out by the present inventors, however, it has been made clear that by adopting superlattices subject to a compressive strain as the conductive layer (i.e., p-type layer or n-type layer) it is possible to reduce the self-compensation and that by doping impurity elements which provide a predetermined conduction type into a II-VI compound semiconductor having the same composition it is possible to control the semiconductor so as to have both p conduction type and n conduction type.

In the layer subjected to a compressive strain, since the distance between the cation and the anion is shortened, the ionicity of the crystal is lowered. In addition, since the strain is concentrated on the vacancy, the formation enthalpy ($\Delta H v$) of the vacancy increases. As a result, the charge compensation (self-compensation) to the carrier generated by the addition of impurities is suppressed, or the generation of a lattice defect itself is suppressed.

Furthermore, when a compressive strain is applied to a compound such as a II-IV compound which crystallizes in the state in which a large atom A is adjacent to a small atom B, since a lower energy is required for filling the vacancy of the large atom A with the small atom B adjacent thereto than for reducing the size of the vacancy by filling the vacancy of the small atom B with the large atom A adjacent thereto, the compressive strain energy concentrates on a larger vacancy, thereby greatly reducing the size of the vacancy. As a result, the vacancy sizes of both atoms A and B are reduced and uniformalized. Since the vacancy size in a II-VI compound has a positive correlation with the bond energy between the vacancy and the carrier (electron, hole), the vacancy size reducing and uniformalizing effect simultaneously mitigates self-compensations with respect to both the electron and hole charges, thereby converting the crystal from unipolarity to bipolarity. In this way, a strain energy is absorbed and relaxed as deformation energy of the vacancy and, as a result, a light emitting layer which is stable and excellent in electric characteristics is obtained in spite of the strained-layer superlattices. Therefore, too small or large strain energy is unsuitable. As a result of investigation, it has been found that the effective degree of lattice-mismatch ($\zeta$) is $0 < \zeta < 20\%$, preferably $1 < \zeta < 9\%$.

According to the present invention, it is possible to adjust a II-VI compound semiconductor layer to a desired conduction type, which has conventionally been difficult, as easily as in the case of an ordinary III-V compound semiconductor layer by using a II-VI compound semiconductor with strained-layer superlattices. Thus, a light emitting device having a novel structure is realized.

Example 1

Figure 1B:
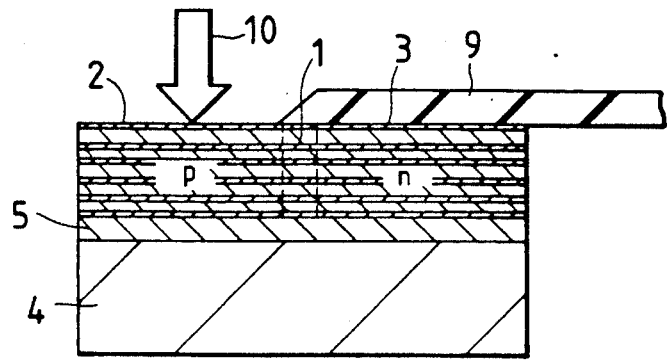
Figure 1C:
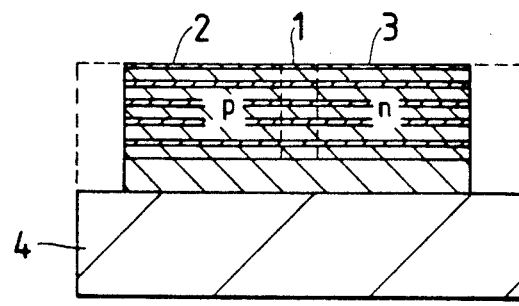
Figure 1D:
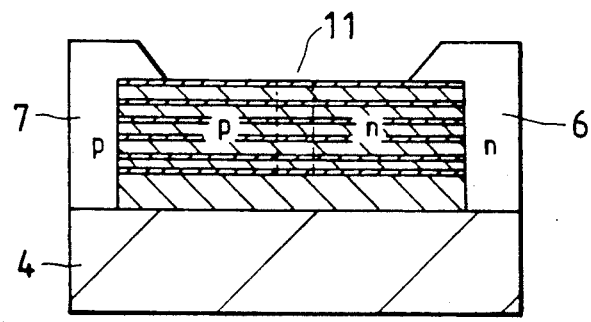
Figure 1E:
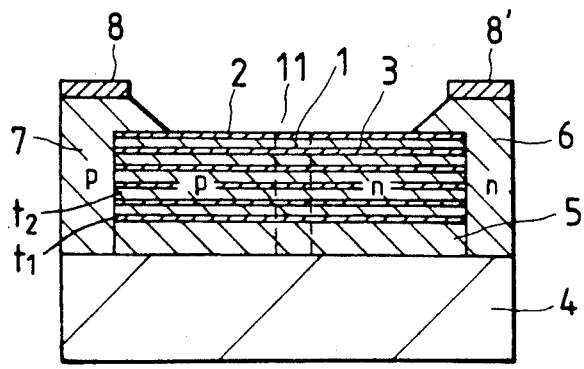

The structure of a first embodiment of a compound semiconductor light emitting device is shown in FIG. 1e. In this embodiment, the strained-layer superlattices consisting of a lamination structure of a $ZnTe_{0.37}S_{0.63}$ layer $t_1$ (30 Å thick), which has an energy gap of Eg=2.6 eV and corresponding to blue light emission, and a ZnS layer $t_2$ (100Å thick) were used as the matrix crystal of an undoped layer region 1, a p-type layer region 2 and an n-type region layer 3 in an active layer. The degree of lattice-mismatch between each two II-I compound semiconductor layers having different compositions was 4.6%. To the $ZnTe_{0.37}S_{0.63}$ layer $t_1$ (corresponding to the first II-I compound semiconductor layer in the present invention) subject to a compression strain N (nitrogen) was introduced as a p-type dopant and I (iodine) was introduced as an n-type dopant, thereby forming p-type and n-type conduction layers. For a substrate 4, high-resistance GaAs was used and a ZnS buffer layer 5 was deposited between the substrate 4 and the active layer to a thickness of 3 μm. After n-type GaAs 6 and p-type GaAs 7 were grown on the side surfaces and a part of the upper portions of the n-type and p-type active layers, respectively, electrodes 8 and 8' were formed. In the following drawings, n represents an n-type semiconductor and p represents a p-type semiconductor.

In this embodiment, blue light emission having a peak at 452 nm in the temperature range of from the temperature of liquid nitrogen to room temperature and a half band width of about 3 nm at a temperature of 77 K was observed when carries were injected.

The process for producing the compound semiconductor light emitting device of this embodiment will now be explained with reference to Figs. 1a to 1e.

FIG. 1a shows the process for fabricating the strained-layer superlattices. On the face (100) of the GaAs substrate 4 heated 400° C., ZnS was first deposited to a thickness of 3 μm as the buffer layer 5 by MOCVD by using diethylzinc as a Zn material and hydrogen sulfide as an S material Thereafter, the $ZnTe_{0.37}S_{0.63}$ layer $t_1$ was deposited to a thickness of 30 Å at a substrate temperature of 400° C. by MOCVD by using a mixture of di-t-butyl tellurium and hydrogen sulfide in a molar ratio of 1.0 as a material of the VI group and diethylzinc as a material of the II group. The molar flow ratio of the material of the VI group to the material of the II group was 2.0. ZnS was then deposited to a thickness of 100 Å as the second compound semiconductor layer $t_2$ in the same way. By the alternate epitaxial growth of the respective 10 layers $t_1$ and $t_2$, the strained-layer superlattices were fabricated.

FIG. 1b shows the process for forming a p-n region by doping impurity elements. $N^+$ (nitrogen) ions 10 were implanted in the p-type region 2 and $I^-$ (iodine) ions were implanted in the n-type region 3 at 70 KeV while using an $SiO_2$ mask 9 and thereafter the device was heated at 450° C. for 1 hour. Through the observation of a TEM (transmission electron microscopic image) it was confirmed that these steps had not damaged the superlattices. The hole density of the p-type region was $5.0 \times 10^{17}$ cm$^{-3}$ and the electron density of the n-type region was $2.0 \times 10^{18}$ cm$^{-3}$. During the ion implantation for forming the p-n region, the portion at which the undoped region 1 (500 Å wide) was to be made was masked both at the time of implanting $N^+$ ions and at the time of implanting $I^-$ ions.

FIG. 1c shows the etching process for forming electrodes on the respective end side surfaces of the p and n regions. The regions, to be etched, of the end side surfaces were exposed (not shown) and etched by ordinary wet etching while masking the main surface.

FIG. 1d shows the process for forming electrodes on both end side surfaces. While covering a light emitting region 11 and the region including the other end side surface with a mask (not shown), the n-type GaAs 6 containing Si having a concentration of $2\times 10^{19}$ cm$^{-3}$ as the impurities or the p-type GaAs 7 containing Zn having a concentration of $3\times 10^{19}$ cm$^{-3}$ as the impurities was formed by MOCVD in correspondence with the conduction type of the end side surface. Thereafter, the ohmic electrodes 8, 8' were formed, as shown in FIG. 1e, thereby completing the device structure. The electrode 8 was made of InZn and the electrode 8' was made of InSn. As a material for MOCVD, trimethylgallium and arsine were used. Dimethylzinc was used as a p-type dopant material and monosilane was used as an n-type dopant material.

The effect of a compressive strain was also observed in the strained-layer superlattices comprising various kinds of $Zn_xCd_{1-x}S_ySe_zTe_{1-y-z}$ in which the degree of lattice-mismatch was not more than 20%. For example, in the semiconductor light emitting device produced by alternately forming 10 strained layers of $Zn_xCd_{1-x}S_ySe_zTe_{1-y-z}$ wherein $x=0.5$, $y=1.0$ and $z=0$ and having a thickness of 20 Å and 10 layers of $Zn_xCd_{1-x}S_ySe_zTe_{1-y-z}$ wherein $x=0.6$, $y=1.0$ and $z=0$ and having a thickness of 100 Å, implanting ions and heating the device as in the above-described way, bluish green light emission having a peak at 495 nm and a half band width of 2.5 nm at a temperature of 77 K was observed when carries were injected by applying a forward current.

Example 2

Figure 2A:
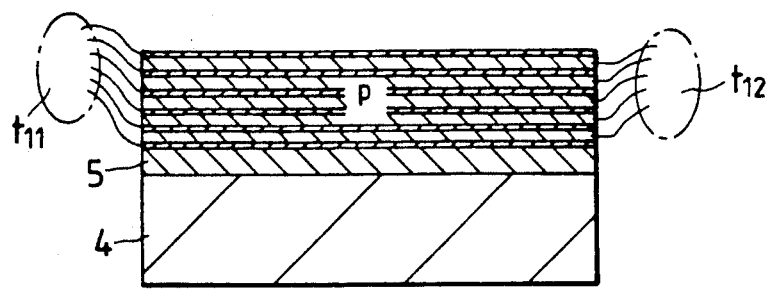
FIGS. 2a to 2g are sectional views showing the process for producing a compound semiconductor light emitting device in another embodiment according to the present invention.
Figure 2B:
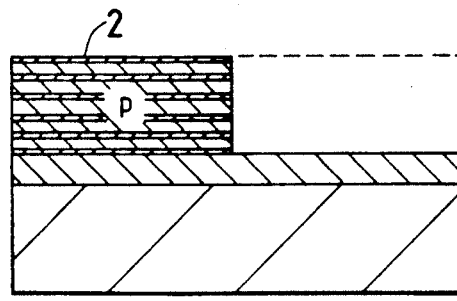
Figure 2C:
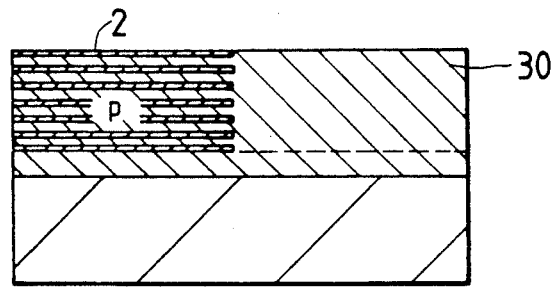
Figure 2D:
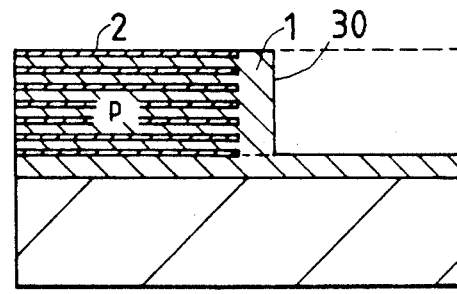
Figure 2E:
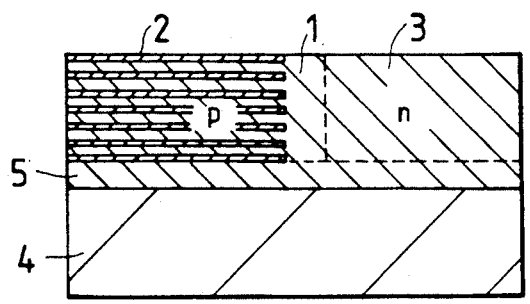
Figure 2F:
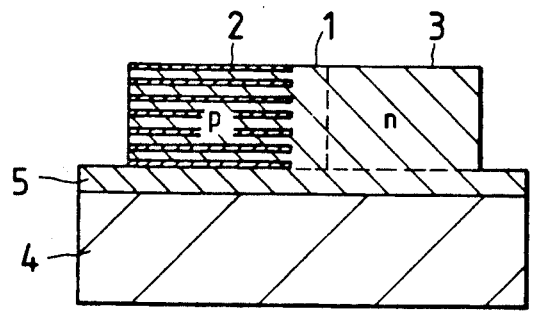
Figure 2G:
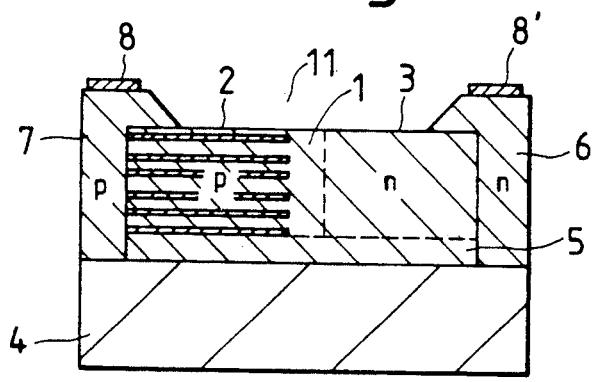

The structure of a second embodiment of a compound semiconductor light emitting device is shown in FIG. 2g. In this embodiment, ZnSe which has an energy gap of Eg=2.7 eV and corresponds to blue light emission was used as the matrix crystal of the undoped layer region 1, the p-type layer region 2 and the n-type region layer 3 in an active layer. As the matrix crystal of the p-type layer region 2, strained-layer superlattices consisting of a lamination structure of a ZnSe layer $t_{11}$ (30 Å thick) and a ZnS layer $t_{12}$ (100 Å thick) were used. The degree of lattice-mismatch between each two II-I compound semiconductor layers having different compositions was 4.3%. To the ZnSe layer $t_{11}$ (corresponding to the first II-I compound semiconductor layer in the present invention) subject to a compression strain, Li was doped, and as the single-layer n-type layer 3, a ZnS layer with Al doped thereinto was used. For the substrate 4, semi-insulating GaAs was used and the ZnS buffer layer 5 was deposited to a thickness of 3 μm between the substrate 4 and the p-type region 2 and the n-type region 3. After the n-type GaAs 6 and p-type GaAs 7 were grown on the side surfaces and a part of the upper portions of the n-type and p-type active layers, respectively, the same electrodes 8 and 8' as in Example 1 were formed. In this embodiment, light emission having a peak at 447 nm in the range of the temperature of liquid nitrogen to room temperature and a half band width of 2.6 nm at a temperature of 77 K was observed when carries were injected.

The process for producing the compound semiconductor light emitting device of this embodiment will now be explained with reference to FIGS. 2a to 2g.

FIG. 2a shows the process for fabricating the strained-layer superlattices. On the face (100) of the GaAs substrate 4 heated to 400° C., ZnS was first deposited to a thickness of 3 μm as the buffer layer 5 by MOCVD by using diethylzinc as a Zn material and hydrogen sulfide as an S material. Thereafter, the p-ZnSe : Li layer $t_{11}$ was deposited to a thickness of 30 Å by MOCVD by using diethylzinc and hydrogen selenide and methyl-cyclopentadienyl lithium (CH$_3$C$_5$H$_5$Li) as the p-type dopant material. The second compound semiconductor ZnS layer $t_{12}$ was then deposited to a thickness of 100 Å by using the same zinc material and hydrogen sulfide. These steps were repeated ten times. The substrate temperature was 400° C., the molar flow ratio of the material of the VI group to the material of the II group was 2 and the flow ratio of the Li material to the zinc material of the II group was 0.1 at the time of forming p-ZnSe. The molar flow ratio of the material of the VI group to the material of the II group was 10 at the time of forming ZnS. The right half of the thus-fabricated strained-layer superlattices was etched by an etchant, as shown in FIG. 2b, thereby forming the p-type region 2. Thereafter, a ZnS layer 30 was selectively formed on the etched portion shown in FIG. 2b, as shown in FIG. 2c. By similar etching, the undoped region 1 was formed, as shown in FIG. 2d. Thereafter, an n-ZnS : Al layer was selectively formed on the etched portion shown in FIG. 2d, thereby producing the region 3 having a single-layer structure shown in FIG. 2e. As the Al material, trimethylaluminum was used. The carrier concentration in the p-type region was $2\times 10^{18}$ cm$^{-3}$ and the carrier concentration in the n-type region was $7\times 10^{18}$ cm$^{-3}$. After etching both end surfaces, as shown in FIG. 2f, the n-type GaAs layer 6 and the p-type GaAs layer 7 were formed as the electrode layers in the same way as in Example 1 shown in FIG. 1d. Thereafter, the ohmic electrodes 8, 8' were formed, as shown in FIG. 2g, in the same way shown in FIG. 1e, thereby completing the device structure.

The effect of a compressive strain was also observed when the strained-layer superlattices consisting of $Zn_xCd_{1-x}S_ySe_zTe_{1-y-z}$ in which the degree of lattice-mismatch was not more than 20% were used for the p-type layer and ZnS and ZnSe were used for the n-type layer. For example, in the semiconductor light emitting device produced by using ZnSe : I for the n-type layer and using, for the p-type layer, alternately formed 10 strained layers of $Zn_xCd_{1-x}S_ySe_zTe_{1-y-z}$ wherein $x=0.9$, $y=0$ and $z=0.5$ and having a thickness of 20 Å and 10 layers of ZnSe having a thickness of 100 Å, green light emission having a peak at 552 nm and a half band width of 3.3 nm at a temperature of 77 K was observed when carries were injected for applying a forward current.

In FIG. 2g, the reference numeral 11 denotes a light emitting region.

Example 3

The structure of a third embodiment of a compound semiconductor light emitting device will be explained with reference to FIG. 1.

In this embodiment, the strained-layer superlattices consisting of a lamination structure of a ZnTe$_{0.8}$S$_{0.2}$ layer (20 Å thick), which has an energy gap of Eg=2.3 eV and correspond to green light emission, and a GaAs layer (200 Å thick) were used as the matrix crystal of the undoped layer region 1, the p-type layer region 2 and the n-type region layer 3 in an active layer. The degree of lattice-mismatch between each two layers was 6.4%. To the ZnTe$_{0.8}$S$_{0.2}$ layer (corresponding to the first II-I compound semiconductor layer in the present invention) subject to a compressive strain, Na was introduced as a p-type dopant and I (iodine) was introduced as an n-type dorpant, thereby forming p- type and n-type conduction layers. For the substrate 4, high-resistance GaAs was used and the ZnSe buffer layer 5 was deposited to a thickness of 3 μm between the substrate 4 and the active layer. After the n-type GaAs 6 and the p-type GaAs 7 were grown on the side surfaces and a part of the upper portions of the n-type and p-type active layers, respectively, the ohmic electrodes 8 and 8' were formed.

In this embodiment, bluish green light emission having a peak at 514 nm in the temperature range of from the temperature of liquid nitrogen to room temperature was observed when carries were injected. The effect of a compressive strain was also observed in the strained-layer superlattices comprising $Zn_xS_ySe_zTe_{1-y-z}$ and $Ga_pIn_qAl_{1-p-q}As_rP_{1-r}$ in which the degree of lattice-mismatch was not more than 20%. For example, in the semiconductor light emitting device produced by alternately forming 10 strained layers of $Zn_xS_ySe_zTe_{1-y-z}$ wherein $x=1.0$, $y=0$ and $z=1.0$ and having a thickness of 20 Å and 10 layers of $Ga_pIn_qAl_{1-p-q}As_rP_{1-r}$ wherein $p=1.0$, $q=0$ and $r=0.2$ by having a thickness of 150 Å, blue light emission having a peak at 442 nm and a half band width of 2.1 nm at a temperature of 77 K was observed when carries were injected for applying a forward current.

Example 4

Figure 3:
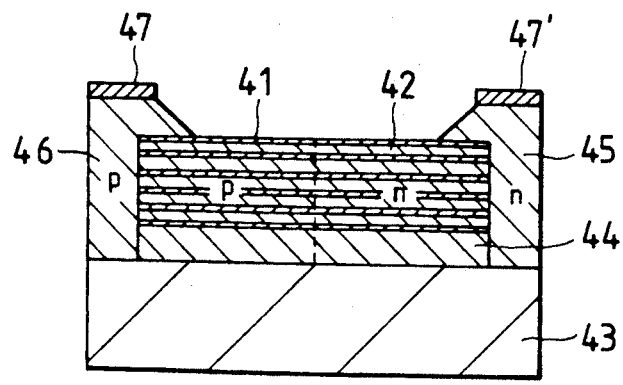
FIGS. 3 and 4a are sectional views showing compound semiconductor light emitting devices in two further embodiments according to the present invention, respectively.

A compound semiconductor light emitting device was produced in the same way as in Example 1. The structure of a fourth embodiment of a compound semiconductor light emitting device according to the present invention is shown in FIG. 3. In this embodiment, the strained-layer superlattices consisting of a lamination structure of a $ZnTe_{0.37}S_{0.63}$ layer t41 (30 Å thick), which has an energy gap of $Eg=2.6$ eV and correspond to blue light emission, and a ZnS layer $t_{42}$ were used as the matrix crystal of a p-type layer region 41 and an n-type region layer 42 in an active layer. The degree of lattice-mismatch between each two II-I compound semiconductor layers having different compositions was 4.6%. To the $ZnTe_{0.37}S_{0.63}$ layer t41 (corresponding to the first II-I compound semiconductor layer in the present invention) subject to a compression strain, N (nitrogen) was introduced as a p-type dopant and I (iodine) was introduced as an n-type dorpant, thereby forming p-type and n-type conduction layers. For a substrate 43, high-resistance GaAs was used and a ZnS buffer layer 44 was deposited to a thickness of 3 μm between the substrate 43 and the active layer. After n-type GaAs 45 and p-type GaAs 46 were grown on the side surfaces and a part of the upper portions of the n-type and p-type active layers, respectively, electrodes 47 and 47' were formed.

In this embodiment, blue light emission having a peak at 452 nm at the temperature of liquid nitrogen and a half band width of 3 nm at a temperature of 77 K was observed when carries were injected.

Example 5

A compound semiconductor light emitting device was produced in the same way as in Example 1. The structure of a fifth embodiment of a compound semiconductor light emitting device according to the present invention is shown in FIG. 4a. In this embodiment, the strained-layer superlattices consisting of a lamination structure of a $ZnTe_{0.50}S_{0.50}$ layer 51 (30 Å thick), which has an energy gap of $Eg=2.5$ eV and correspond to blue green light emission, and a $ZnS_{0.02}Se_{0.98}$ layer 52 (100 Å thick) were used and as the matrix crystal of an undoped region 51, a p-type layer region 52 and an n-type region layer 53 in an active layer. The degree of lattice-mismatch between each two II-VI compound semiconductor layers having different compositions was 1.8%. To the $ZnTe_{0.50}S_{0.50}$ layer 51 (corresponding to the first II-VI compound semiconductor layer in the present invention) subject to a compression strain, N (nitrogen) was introduced as a p-type dopant and I (iodine) was introduced as an n-type dorpant, thereby forming p-type and n-type conduction layers. For a substrate 54, high-resistance GaAs was used and a $ZnS_{0.02}Se_{0.98}$ buffer layer 55 was deposited to a thickness of 3 μm between the substrate 54 and the active layer. After n-type ZnSe 56 and p-type ZnSe 57 were grown on the side surfaces and a part of the upper portions of the n-type and p-type active layers, respectively, an electrode 58 of InGa and an electrode 58' of Au were formed.

Figure 4C:
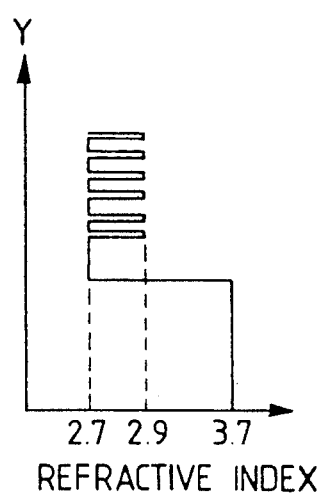
FIGS. 4b and 4c are the graphs showing the refractive index distributions in the sections X—X' and Y—Y' in FIG. 4a, respectively.
Figure 4A:
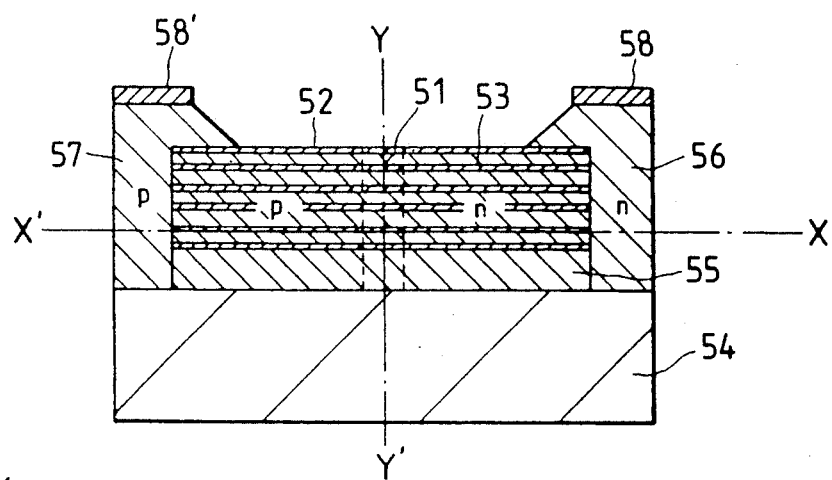
Figure 4B:
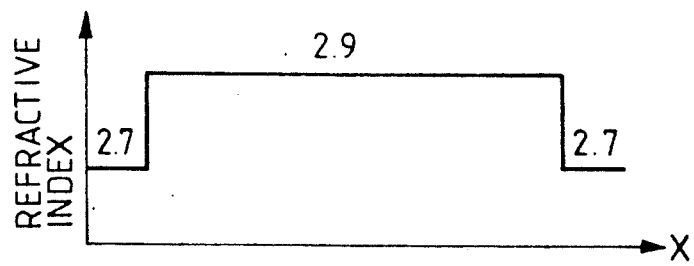

The refractive index distributions in the sections X—X' and Y—Y' are shown in FIGS. 4b and 4c, respectively. In this embodiment, at least the side surfaces and the bottom portion of the compound semiconductor light emitting device were composed of a material having a small refractive index, and the wall surface and the bottom portion were used as a reflective surface and the light emitting region including the p-type layer and the n-type layer had an optical confinement structure.

In this embodiment, blue green light emission having a peak at 496 nm in the temperature range of from the temperature of liquid nitrogen to room temperature and a half band width of about 2.5 nm at a temperature of 77 K was observed when carries were injected for applying a forward current.

Example 6

Compound semiconductor light emitting devices were produced in the same way as in Example 1 except for using ZnSe, $ZnS_{0.44}Se_{0.30}Te_{0.26}$ and ZnTe, respectively, for the first II-I compound semiconductor layer $t_1$. ZnTe is a compound semiconductor which is unlikely to assume an n-type, while ZnSe and $ZnS_{0.44}Se_{0.30}Te_{0.26}$ are compound semiconductors which are unlikely to assume a p-type. The structure of each of the light emitting devices is the same as that shown in FIG. 1e except for the composition of the first compound semiconductor layer $t_1$.

When the first compound semiconductor layer $t_1$ was composed of ZnSe, Li and Na were used as a p-type dorpant. The molar ratio of Na/Li was 0.32. Further, combinations of Li and Au, Li and Ag and Li, Au and Ag were also examined as the p-type dopant. Li and As were also used as a p-type dopant and the molar ratio of Li/As was 0.47.

When the first compound semiconductor layer $t_1$ was composed of $ZnS_{0.44}Se_{0.30}Te_{0.26}$, N and As were used as a p-type dopant. The molar ratio of N to As was 1 to 47.

When the first compound semiconductor layer $t_1$ was composed of ZnTe, Al and In were used as an n-type dopart. The molar ratio of Al to In was 2.57.

In this way, when a semiconductor light emitting device having the structure shown in FIG. 1e was produced in the same way as in Example 1 except for using an element having a large covalent radius together with an element having a small covalent radius as the dopant for the conductivity which has conventionally been considered to be difficult to control, a compound semiconductor light emitting device capable of blue to green light emission having a higher luminance than the light emission obtained in Example 1 by using only the strained-layer superlattices was obtained.

As is clear from the above description, according to the present invention, since the strained-layer superlattices composed of II-VI compound semiconductors are employed, it is possible to artificially provide a II-VI compound semiconductor with an n-type or p-type region, which has conventionally been considered to be difficult, as easily as in the case of an ordinary III-V compound semiconductor layer, by doping conduction-type imparting impurity elements to the II-VI compound semiconductor. According to the present invention, since a p-n homojunction can be formed in the II-VI compound semiconductor, carrier injection type high-efficiency visible light emitting device is realized. Since a II-VI group compound has a larger band gap energy than a III-V group compound, light emission in a short wavelength region such as a wavelength region of 0.35 $\mu$m to 0.60 $\mu$m, which is difficult to obtain by a III-group compound, in particular, green to blue light emission is effectively realized. By varying the combination, the composition ratio, etc. of the elements constituting a II-VI compound, it is possible to obtain a device having a desired light emitting wavelength.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A compound semiconductor light emitting device comprising at least:

strained-layer superlattices formed on a substrate, the strained-layer superlattices each being comprised of a plurality of first compound semiconductor layers and a plurality of second compound semiconductor layers, the strained-layer superlattices each being formed by alternately laminating one of the plurality of first compound semiconductor layers with one of the plurality of second compound semiconductor layers, each of the plurality of first compound semiconductor layers being comprised of a II-IV compound semiconductor epitaxial layer, and each of the plurality of second compound semiconductor layers being comprised of a compound semiconductor epitaxial layer selected from a group consisting of II-VI compound semiconductors epitaxial layers and III-V compound semiconductor epitaxial layers and having a different composition from that of said plurality of first compound semiconductor layers the plurality of second compound semiconductor layers each having a smaller lattice constant than that of the plurality of first compound semiconductor layers, a degree of lattice mismatch between each of the plurality of first compound semiconductor layers and adjacent ones of the plurality of second compound semiconductor layers being not more than 20%;

a first conductivity type impurity diffusion region formed in at least each of said plurality of first compound semiconductor layers of the strained-layer superlattice, extending into the strained-layer superlattice from a first end side surface of the first conductivity type impurity diffusion region;

a second conductivity type region having an opposite conductivity type to said first conductivity type and so formed as to be adjacent to said first conductivity type impurity diffusion region, said second conductivity type region having a second end side surface furthest from the first conductivity type impurity diffusion region; and electrodes provided on the first and second end side surfaces respectively of said first conductivity type impurity diffusion region and said second conductivity type region.

2. A compound semiconductor light emitting device according to claim 1, wherein said degree of lattice-mismatch is 1 to 9%.

3. A compound semiconductor light emitting device according to claim 1, wherein a thickness of each of said plurality of first compound semiconductor layers is not more than 40 Å, and a thickness of each of said plurality of second compound semiconductor layers is larger than the thickness of each of said plurality of first compound semiconductor layers by not less than 60 Å.

4. A semiconductor compound light emitting device according to claim 3, wherein a difference in thickness between each of said plurality of first compound semiconductor layers and each of said plurality of second compound semiconductor layers is 100 to 500Å.

5. A compound semiconductor light emitting device according to claim 1, wherein said second compound semiconductor layers are II-VI compound semiconductor epitaxial layers having a different composition from said first compound semiconductor layers.

6. A compound semiconductor light emitting device according to claim 1, wherein said second compound semiconductor layers are III-V compound semiconductor epitaxial layers.

7. A compound semiconductor light emitting device according to claim 6, wherein said III-compound semiconductor epitaxial layer is comprised of at least one element of the III group selected from the group consisting of gallium, indium and aluminum and at least one element of the V group selected from the group consisting of arsenic and phosphorus.

8. A compound semiconductor light emitting device according to claim 1, wherein each of said electrodes provided on the first and second end side surfaces, respectively of said first conducting type impurity diffusion region and said second conduction type region is comprised of a III-V compound with the corresponding type of impurities diffused therein, and a metal terminal electrode is further provided on each of said electrodes in ohmic contact therewith as a lead-in electrode.

9. A compound semiconductor light emitting device according to claim 8, wherein each of said electrodes comprised of said III-V compound with impurities diffused therein and a portion of said substrate adjacent to said strained-layer superlattice have smaller refractive indices than a light emitting region including said first conducting type impurity diffusion region and said second conductivity type region.

10. A compound semiconductor light emitting device according to claim 1, wherein said second conducting type region adjacent to said first conducting type impurity diffusion region a second conductivity type impurity diffusion region.

11. A compound semiconductor light emitting device according to claim 10, wherein said second conductivity type region is adjacent to said first conductivity type impurity diffusion region through an undoped region of said first compound semiconductor layers.

12. A compound semiconductor light emitting device according to claim 1, wherein said second conductivity type region, which is formed to be adjacent to the first conductivity type impurity diffusion region, is a single-layer second conductivity type semiconductor layer comprised of a semiconductor material selected from the group consisting of a second conductivity type unipolar II-VI compound semiconductor and a second conductivity type III-V compound semiconductor with impurities diffused therein and provided in contact with an end side surface of said strained-layer superlattice furthest from said first end side surface.

13. A compound semiconductor light emitting device according to claim 1, where said II-VI compound semiconductor epitaxial layer is comprised of at least one element of the II group selected from the group consisting of zinc and cadmium, and a chalcogen, which is an element of the VI group.

14. A compound semiconductor light emitting device according to claim 1, wherein a surface of said substrate adjacent to said strained-layer superlattice is comprised of a buffer layer.

15. A compound semiconductor light emitting device according to claim 1, wherein said second conductivity type region is so formed as to be adjacent to said first conductivity type impurity diffusion region through an undoped region of said first compound semiconductor layers.

16. A compound semiconductor light emitting device comprising at least:
strained-layer superlattices formed on a substrate, the strained-layer superlattices each being comprised of a plurality of first compound semiconductor layers and a plurality of second compound semiconductor layers, the strained-layer superlattices each being formed by alternately laminating one of the plurality of first compound semiconductor layers with one of the plurality of second compound semiconductor layers each of the plurality of first compound semiconductor layers being comprised of a II-VI compound semiconductor epitaxial layer, and each of the plurality of second compound semiconductor layers being comprised of a compound semiconductor epitaxial layer selected from the group consisting of II-V compound semiconductor epitaxial layers and III-V compound semiconductor epitaxial layers and having a different composition from that of said plurality of first compound semiconductor layers, the plurality of second compound semiconductor layers each having a smaller lattice constant than that of the plurality of first compound semiconductor layers, a degree of lattice mismatch between each of the plurality of first compound semiconductor layers and adjacent ones of the plurality of second compound semiconductor layers being not more than 20%;
a first conductivity type impurity diffusion region formed in at least each of said first compound semiconductor layers, extending into the strained-layer superlattice from a first end side surface of the first conductivity type impurity diffusion region, the first conductivity type impurity diffusion region including impurities of the first conductivity type;
a second conductivity type region having an opposite conductivity type to said first conductivity type and so formed as to be adjacent to said first conductivity type impurity diffusion region, said second conductivity type region having a second end side surface furthest from the first conductivity type impurity diffusion region; and
electrodes provided on the first and second end side surfaces, respectively, of said first conductivity type impurity diffusion region and said second conductivity type region;
wherein said impurities in said first conductivity type impurity diffusion region consist of an element having a larger covalent radius and an element having a smaller covalent radius than that of one of the Group II element and the Group VI element which constitutes said plurality of first compound semiconductor layers.

17. A compound semiconductor light emitting device comprising at least:
strained-layer superlattices formed on a substrate, the strained-layer superlattices each being comprised of a plurality of first compound semiconductor layers and a plurality of second compound semiconductor layers, the strained-layer superlattices each being formed by alternately laminating one of the plurality of first compound semiconductor layers with one of the plurality of second compound semiconductor layers, each of the plurality of first compound semiconductor layers being composed of a II-VI compound semiconductor epitaxial layer, and each of the plurality of second compound semiconductor layers being comprised of a compound semiconductor epitaxial layer selected from the group consisting of II-VI compound semiconductor epitaxial layers and III-V compound semiconductor epitaxial layers and having a different composition from that of said plurality of first compound semiconductor layers, the plurality of second compound semiconductor layers each having a smaller lattice constant than that of the plurality of first compound semiconductor layers, a degree of lattice mismatch between each of the plurality of first compound semiconductor layers and adjacent ones of the plurality of second compound semiconductor layers being not more than 20%;
a first conductivity type impurity diffusion region formed in at least each of said first compound semiconductor layers, extending into the strained-layer superlattice from a first end side surface of the first conductivity type impurity diffusion region, said first conductivity type impurity diffusion region having impurities of the first conductivity type therein, with said impurities in said first conductivity type impurity diffusion region consisting of an element having a larger covalent radius and an element having a smaller covalent radius than that of one of the Group II element and the Group VI element which constitutes said plurality of first compound semiconductor layers;
a second conductivity type region having an opposite conductivity type to said first conductivity type and so formed as to be adjacent to said first conductivity type impurity diffusion region, said second conductivity type region having a second end side surface furthest from the first conductivity type impurity diffusion region; and
electrodes provided on the first and second end side surfaces respectively of said first conductivity type impurity diffusion region and said second conductivity type region;
wherein said second conductivity type region adjacent to said first conductivity type impurity diffusion region is a second conductivity type impurity diffusion region.

* * * * *